(12) United States Patent
Kawai

(10) Patent No.: US 10,973,160 B2
(45) Date of Patent: Apr. 6, 2021

(54) COMPONENT MOUNTING MACHINE

(71) Applicant: FUJI CORPORATION, Chiryu (JP)

(72) Inventor: Hidetoshi Kawai, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 386 days.

(21) Appl. No.: 15/743,719

(22) PCT Filed: Jul. 29, 2015

(86) PCT No.: PCT/JP2015/071452
§ 371 (c)(1),
(2) Date: Jan. 11, 2018

(87) PCT Pub. No.: WO2017/017802
PCT Pub. Date: Feb. 2, 2017

(65) Prior Publication Data
US 2018/0199479 A1  Jul. 12, 2018

(51) Int. Cl.
*H05K 13/04* (2006.01)
*H05K 13/00* (2006.01)
*H05K 13/08* (2006.01)

(52) U.S. Cl.
CPC ..... *H05K 13/0417* (2013.01); *H05K 13/0061* (2013.01); *H05K 13/0857* (2018.08); *Y10T 29/53174* (2015.01)

(58) Field of Classification Search
CPC ........... H05K 13/0417; H05K 13/0857; H05K 13/0061
See application file for complete search history.

(56) References Cited

U.S. PATENT DOCUMENTS

| 6,988,612 B1 | 1/2006 | Kabeshita et al. |
| 7,543,259 B2 | 6/2009 | Oohashi et al. |

(Continued)

FOREIGN PATENT DOCUMENTS

| CN | 1838871 A | 9/2006 |
| EP | 2 986 952 A1 | 1/2016 |

(Continued)

OTHER PUBLICATIONS

Combined Chinese Office Action and Search Report dated Nov. 22, 2019 in corresponding Chinese Patent Application No. 201580081976.9 (with English Translation), 14 pages.

(Continued)

*Primary Examiner* — Livius R. Cazan
(74) *Attorney, Agent, or Firm* — Oblon, McClelland, Maier & Neustadt, L.L.P.

(57) ABSTRACT

A component mounting station is divided into two component mounting areas in a board conveyance direction according to the size of circuit boards used in two types of production that are performed in order, and the area in which a backup pin is arranged on a backup plate is divided into two pin arrangement areas corresponding to the two component mounting areas. The quantity of backup pins necessary to support the component mounting board are arranged in a predetermined arrangement pattern, the circuit boards transported using the conveyor are stopped in the component mounting areas according to the type of component mounting board produced, the backup plate is lifted up, and the circuit boards are clamped by the clamp member, and the circuit boards supported by the backup pins in the pin arrangement areas are positioned below the circuit boards, and components are mounted on the circuit boards.

6 Claims, 5 Drawing Sheets

(56) References Cited

U.S. PATENT DOCUMENTS

| | | |
|---|---|---|
| 8,661,657 B2 | 3/2014 | Ito et al. |
| 2009/0049681 A1 | 2/2009 | Yagi et al. |
| 2016/0021801 A1* | 1/2016 | Nagaya .............. H05K 13/0061 198/339.1 |

FOREIGN PATENT DOCUMENTS

| | | |
|---|---|---|
| JP | 2009-054620 A | 3/2009 |
| JP | 2010-062591 A | 3/2010 |
| JP | 2011-119351 A | 6/2011 |
| JP | 2011-233736 A | 11/2011 |
| JP | 2014-136212 A1 | 9/2014 |
| JP | 2014-222687 A | 11/2014 |
| JP | 2014222687 A * | 11/2014 |
| WO | WO 2014/136425 A1 | 9/2014 |

OTHER PUBLICATIONS

International Search Report dated Nov. 2, 2015, in PCT/JP2015/071452 filed Jul. 29, 2015.

Extended European Search Report dated Feb. 22, 2019 in European Patent Application No. 15899635.5, 11 pages.

* cited by examiner

COMPONENT MOUNTING MACHINE

TECHNICAL FIELD

The present disclosure relates to a component mounting machine that mounts a component on a circuit board in a state in which the circuit board that is transported to a component mounting station using a conveyor is supported from below by a backup member such as multiple backup pins.

BACKGROUND ART

Typically, as described in PTL 1 (JP-A-2010-62591), PTL 2 (JP-A-2011-233736), and the like, a component mounting machine is provided with a conveyor which transports a circuit board to a component mounting station, a backup plate is disposed below the component mounting station to be movable up and down, multiple backup pins are disposed on the backup plate to be replaceable, and a component mounting board is produced by picking up various components that are supplied from a component supply device using an suction nozzle of a mounting head and mounting the components on a circuit board in a state with the circuit board supported from below by an upper end portion of the multiple backup pins by lifting the backup plate after transporting of the circuit board. In this case, in a case where the type, size, and the like of a component mounting board to be produced is changed, setup changeover is carried out to change the arrangement pattern or quantity of backup pins that are disposed on the backup plate in advance according to the type, size, and the like of the component mounting board to be produced.

Setup changeover work in which a backup pin is arranged on the backup plate is manual work performed by an operator, or as described in PTL 3 (WO-2014/136212), a stocker that stores multiple backup pins to be arranged on the backup plate is disposed in a component mounting machine, and the backup pins are grasped in the stocker using a chuck that is attached to a mounting head of the component mounting machine and are automatically arranged on the backup plate.

CITATION LIST

Patent Literature

PTL 1: JP-A-2010-62591
PTL 2: JP-A-2011-233736
PTL 3: WO-2014/136212

SUMMARY

In recent years, the number of times that production is switched has tended to rise accompanying an increase in demand for small quantity production of multiple types of products. Conventionally, setup changeover work of changing the arrangement pattern or the quantity of backup pins that are arranged on a backup plate according to the type, size, or the like of a component mounting board to be produced is performed during each production switch, leading to a disadvantage in that productivity is reduced due to a total setup changeover time in one day (=setup changeover time per one time x the number of times of setup changeover in one day) increasing, thus reducing production time in one day (operating rate of a component mounting machine).

Therefore, the problem to be solved by the present disclosure is to provide a component mounting machine that is able to shorten the total setup changeover time in one day to improve productivity (operating rate).

In order to solve the problem, the present disclosure provides a component mounting machine that is provided with a conveyor which transports a circuit board to a component mounting station, a backup plate that is disposed below the component mounting station to be movable up and down, and multiple backup members (backup pins and the like) that are arranged on the backup plate to be replaceable, wherein a component mounting board is produced by mounting a component on the circuit board by supporting the circuit board that is transported to the component mounting station by the multiple backup members from below by lifting the backup plate, the component mounting station is divided into multiple component mounting areas in a board conveyance direction, it is possible to produce various different types of component mounting boards in each component mounting area, the area in which the backup member is arranged on the backup plate is divided into multiple member arrangement areas corresponding to the multiple component mounting areas and a required quantity of the backup members, which are necessary to support the component mounting board that is produced in each component mounting area in each member arrangement area in advance, are arranged in a predetermined disposal pattern, and control means for controlling actions of the component mounting machine stops a circuit board that is transported on the conveyor in the component mounting area according to the type of component mounting board to be produced, lifts the backup plate, supports the circuit board by the backup member of the member arrangement area that is positioned below the circuit board, and mounts the component on the circuit board.

In this configuration, since it is possible to divide and arranged the backup members used in multiple instances of production in advance in multiple member arrangement areas on the backup plate, it is not necessary to perform setup changeover of the backup member every time there is a production switch, and it is possible to lower the number of times of setup changeover of the backup members. Thereby, it is possible to efficiently perform setup changeover of the backup member, and it is possible to improve productivity (operating rate of a component mounting machine) by narrowing the total setup changeover time in one day.

In the present disclosure, setup changeover of the backup member may be manually performed by an operator, or the setup changeover may be automated. In the case of automation, a stocker that stores multiple backup members for arranging on the backup plate and a mounting head to which a chuck that is able to hold the backup members is attached may be installed on the component mounting machine, the control means may control a moving action of the mounting head and the opening and closing action of the chuck, and control an action for gripping the backup member on the backup plate with the chuck and storing the backup member in the stocker, and an action for gripping the backup member with the chuck according to each member arrangement area from the multiple backup members that are stored in the stocker and arranging the backup member in each member arrangement area. Thereby, it is possible to automate work for disposing the backup member in multiple member arrangement areas on the backup plate.

Typically, since a component mounting line for producing a component mounting board is configured by arranging multiple component mounting machines along the board conveyance direction, there is a possibility that idle time (waiting time) occurs in which component mounting actions are not performed during production according to a state of progress of production of adjacent component mounting machines.

Focusing on this point, in the component mounting machine in which arrangement work of the backup member is automated, when arranging the backup member in each member arrangement area in advance (before the start of initial production), determining whether it is possible to arrange the backup member in the member arrangement area that is used in later production by using idle time during previous production based on a production plan in which a multiple instances of production are performed in order, and in a case where it is determined that arrangement is possible, the backup member is not arranged in advance in the member arrangement area that is used in later production, and the backup member may be arranged using idle time during previous production. By doing this, since it is possible to perform setup changeover of the backup member that is used in later production using idle time during previous production, it is not necessary to perform in advance setup changeover of the backup member that is used in later production, and it is possible to shorten setup changeover time that is performed in advance (before the start of initial production).

In addition, in a case where a large component mounting board with a large length dimension in the board conveyance direction is produced, there is a possibility that it is not possible to divide the component mounting station into multiple component mounting areas.

Therefore, it is determined whether it is possible to divide the component mounting station into a multiple component mounting areas in the board conveyance direction based on a production plan in which multiple instances of production are performed in order, in a case where it is determined that division is not possible, one component mounting area may be set without dividing the component mounting station into multiple component mounting areas, and one member arrangement area may be set without dividing the backup plate into multiple member arrangement areas. By doing this, it is possible to also produce a large component mounting board in which it is not possible to divide the component mounting station into multiple component mounting areas.

Typically, the conveyor of a component mounting machine is configured to be able to adjust a conveyor width according to the width of the component mounting board to be produced. In this case, concerning a region that becomes an obstacle to the widening and narrowing of the conveyor width out of each member arrangement area on the backup plate, there is a case in which it is not possible to arrange the backup member that is used in later production in advance, or it may be necessary to recover the backup member that is used in previous production after previous production ends.

Therefore, in a case where a component mounting board with a narrow board width out of two types of component mounting boards with different board widths is produced in advance and thereafter a component mounting board with a wide board width is produced by widening the conveyor width, a component mounting board may be produced with a narrow board width at a conveyor width before widening by arranging backup members as much as it is possible to arrange at the conveyor width before widening in each member arrangement area on the backup plate before the start of previous production and a component mounting board may be produced with a wide board width at a conveyor width after widening by additionally arranging backup members by the insufficient amount in the member arrangement area in which the number of backup members is insufficient by widening the conveyor width after the production ends.

In addition, in a case where a component mounting board with a wide board width out of two types of component mounting boards with different board widths is produced in advance and thereafter a component mounting board with a narrow board width is produced by narrowing the conveyor width, a component mounting board may be produced with a wide board width at a conveyor width before narrowing by arranging the necessary number of backup members in each member arrangement area on the backup plate before the start of previous production and a component mounting board may be produced with a narrow board width at a conveyor width by narrowing the conveyor width after recovering backup members that become an obstacle to narrowing the conveyor width out of the backup members that are arranged in the member arrangement area that is used in previous production after the production ends.

In either case, after the conveyor width is changed after previous production ends, by using the idle time during subsequent production, recovering the remaining used backup members of the previous production eliminates waste of time.

In addition, the feeder installation section in which multiple feeders that supply components are arranged, a mounting head that holds a component that is supplied by the feeder and mounts the component on the circuit board, and a component imaging camera that images from below the component that is held by the mounting head may be provided, in the feeder installation section, the feeder arrangement area to be used is classified for each type of component mounting board to be produced, the component imaging camera is disposed in the center in the board conveyance direction of the region between the feeder installation section and the conveyor, the component that is held by the mounting head may be imaged by the component imaging camera while moving the component within the visual field of the component imaging camera (so-called on-the-fly imaging) in the middle of movement of the component that is held by the mounting head from the feeder arrangement area to the component mounting area, and disposition of the multiple feeder arrangement areas of the feeder installation section and disposition of multiple component mounting areas of the component mounting station may be disposed such that the positional relationship between the feeder arrangement area and the component mounting area used for each type of component mounting board to be produced is a positional relationship symmetrically close to the position of the component imaging camera. By doing this, in a case where the component that is held by the mounting head via a component imaging area is imaged by the component imaging camera in the middle of moving the mounting head from the feeder arrangement area to the component mounting area, it is possible to reduce the curvature of the movement path of the mounting head from the feeder arrangement area to the component mounting area via the component imaging area. Thereby, it is possible to perform on the on-the-fly imaging by moving the component that is held in the mounting head while increasing movement speed of the mounting head at a constant speed within the visual field of the component imaging camera, and it is possible to shorten the cycle time by shortening time that is necessary for imaging of the component.

DESCRIPTION OF EMBODIMENTS

Figure 1:
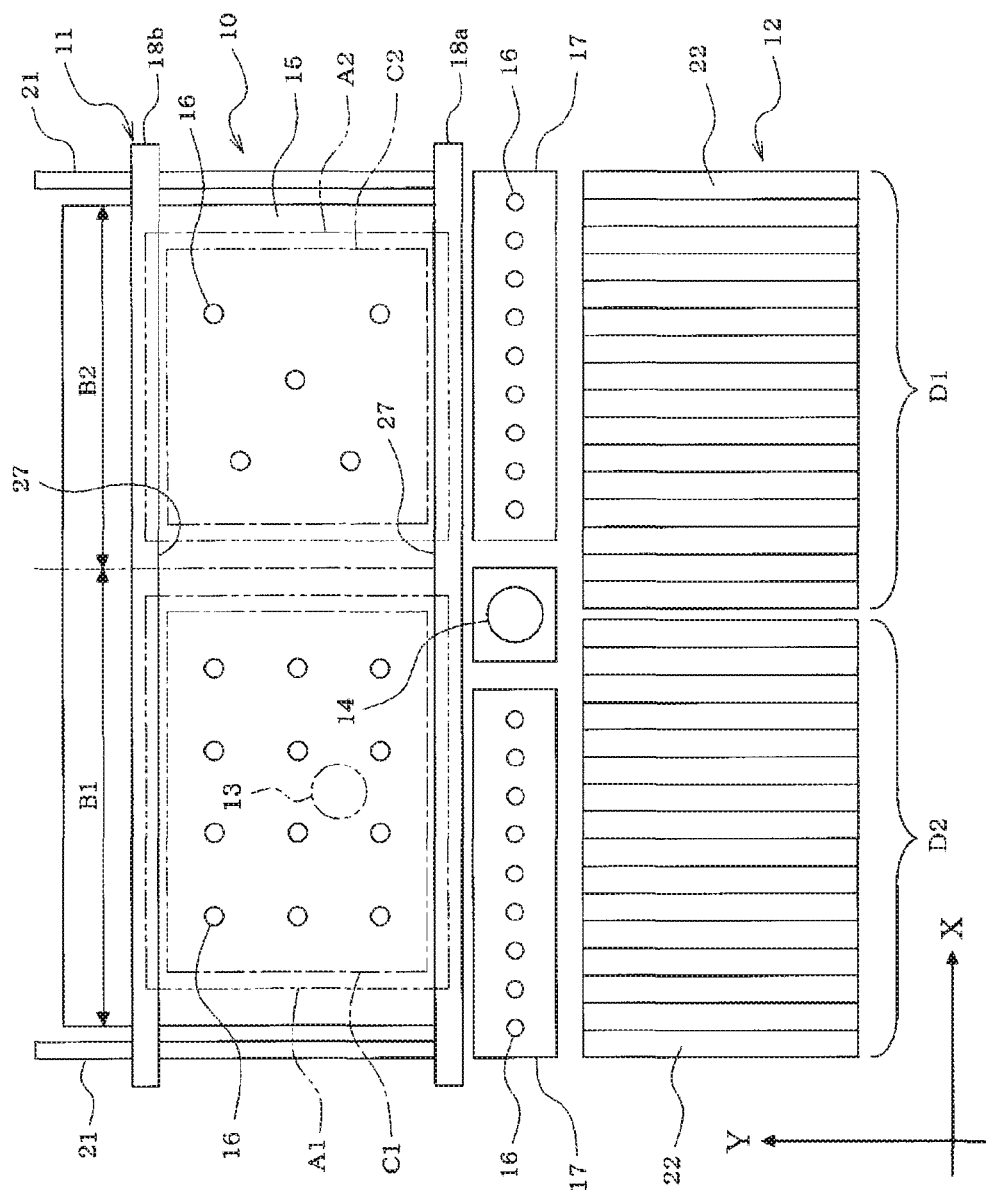
FIG. 1 is a plan view of a main part of a component mounting machine illustrating an embodiment of the present disclosure.

An embodiment of the present disclosure will be described below. As shown in FIG. 1, a component mounting machine of the present embodiment is configured to be provided with conveyor 11 that conveys circuit boards A1 and A2 to component mounting station 10 one at a time, feeder installation section 12 in which multiple feeders 22 that supply a component are arranged, mounting head 13 that mounts the component that is supplied by each feeder 22 on the circuit boards A1 and A2 by picking up the component using a suction nozzle (not shown in the drawings), component imaging camera 14 that images the component that is held by the suction nozzle of mounting head 13 from the underside of the component, stocker 17 that stores multiple backup pins 16 (backup members) to be arranged on backup plate 15 that will be described later, and the like. Stocker 17 is disposed in a vacant space in a movement range of mounting head 13, and it is possible to grip backup pin 16 in stocker 17 using a chuck (not shown in the drawings) that is held to be replaceable with the suction nozzle (not shown in the drawings) on mounting head 13 and automatically arrange backup pins 16 on backup plate 15.

Figure 2:
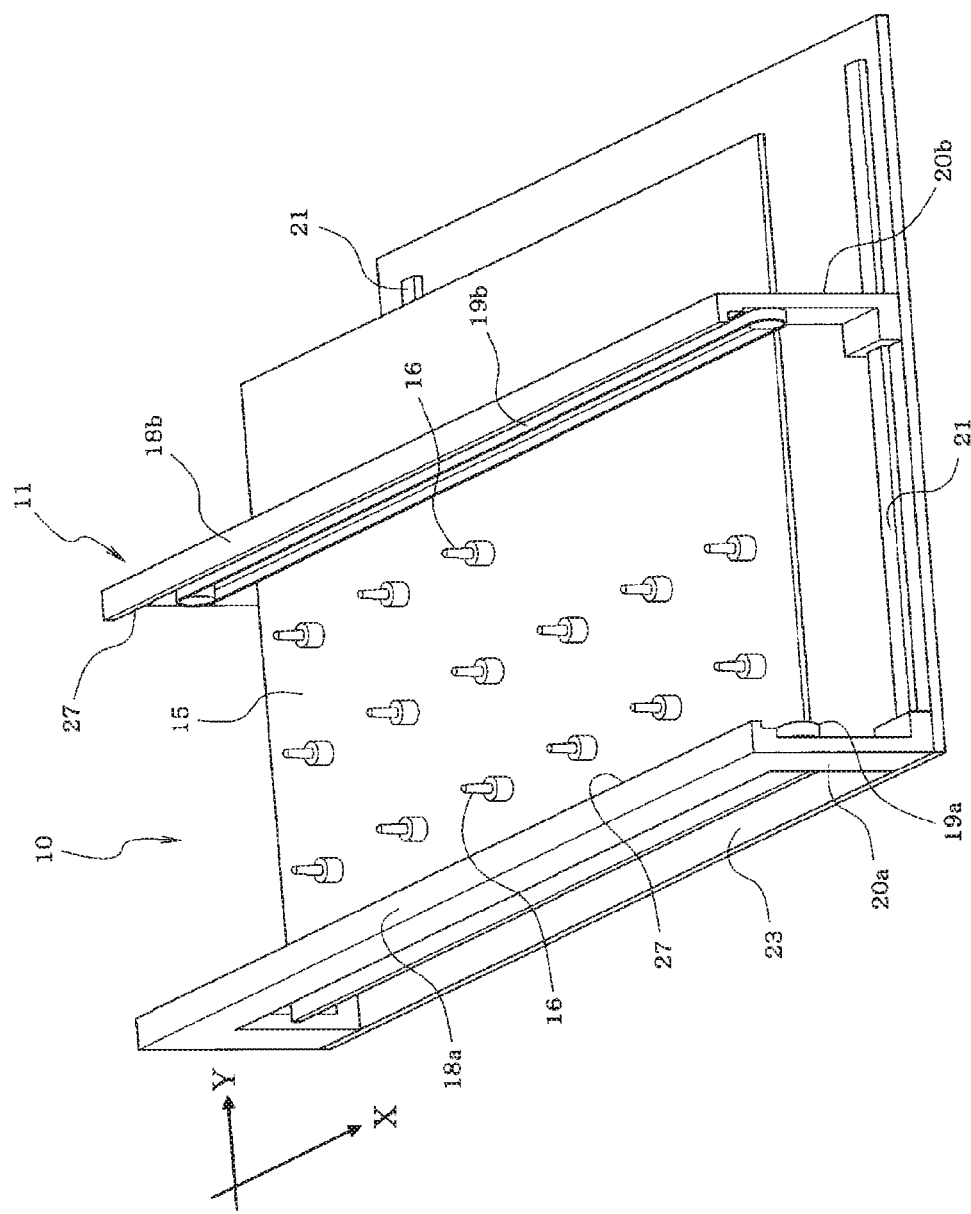
FIG. 2 is a perspective view illustrating a configuration of a conveyor and a peripheral part of the conveyor.

As shown in FIG. 2, support member 20a out of support members 20a and 20b that support conveyor rails 18a and 18b, and conveyor belts 19a and 19b that constitute conveyor 11 is fixed at a fixed position on base plate 23, and the width of conveyor 11 (gap between conveyor rails 18a and 18b) is able to be adjusted to match the width of the circuit boards A1 and A2 by adjusting a Y-direction position of support member 20b on the opposite side (position of a direction perpendicular to an X-direction that is a board conveyance direction) along guide rail 21 using a feed screw mechanism (not shown in the drawings) or the like.

Backup plate 15 on which backup pin 16 is loaded is provided below component mounting station 10 to be movable up and down in a horizontal state. Backup plate 15 is formed by a magnetic material such as iron, and it is possible to load and fix backup pin 16 at any position on backup plate 15 using a magnet (not shown in the drawings) that is provided on a lower portion of backup pin 16. Backup plate 15 is configured so as to be lifted and lowered by lifting and lowering mechanism 25 (refer to FIG. 3); a lower limit position during a lowering action is a board unclamping position that is illustrated in FIG. 3(a) and an upper limit position during a lifting action is aboard clamping position that is illustrated in FIG. 3(b).

Figure 3:
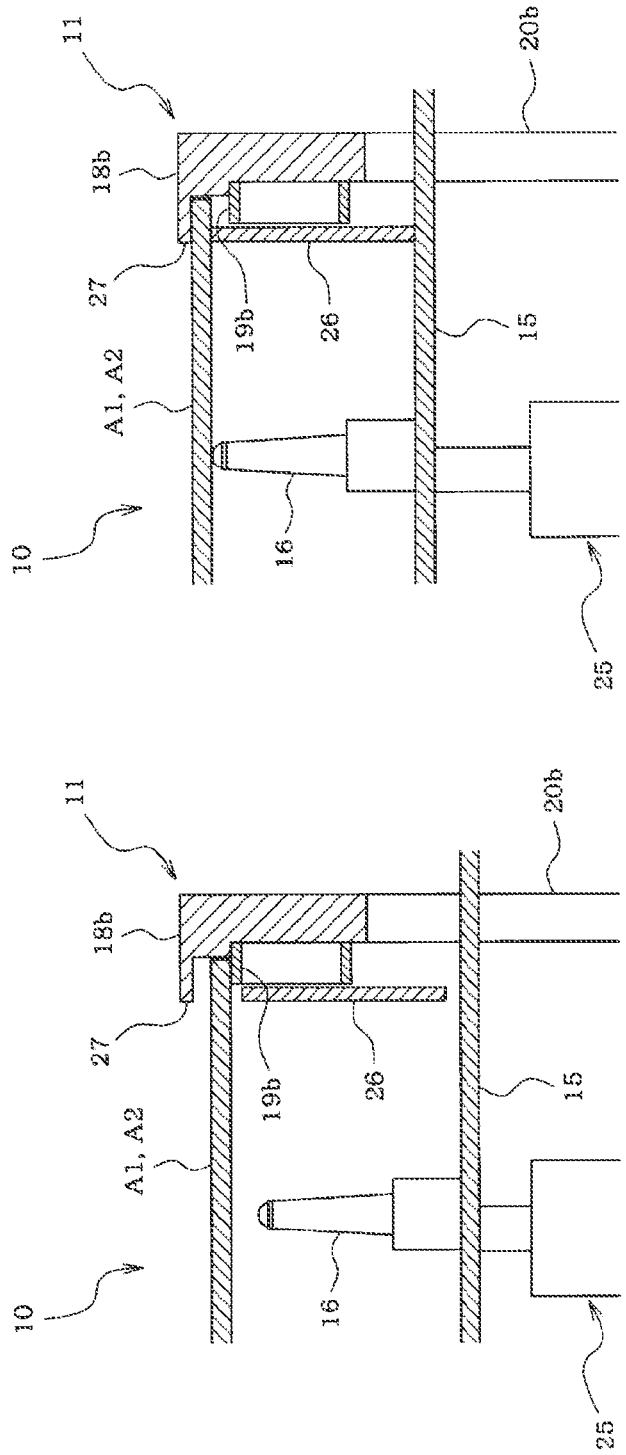
FIG. 3(a) is an enlarged longitudinal sectional view illustrating a state when a board is unclamped (during board conveyance)
FIG. 3(b) is an enlarged longitudinal sectional view illustrating a state when the board is clamped.

Clamp member 26 with a plate shape (only a part is illustrated in FIG. 3) is provided inside support members 20a and 20b of conveyor rails 18a and 18b to be movable up and down along the inside of conveyor belts 19a and 19b, and clamp member 26 is moved up and down accompanying up and down movement of backup plate 15.

As shown in FIG. 3(a), an upper end of backup pin 16 on backup plate 15 is at a lower position than the lower face of the circuit boards A1 and A2 on the conveyor 11 in a state in which backup plate 15 is lowered to the board unclamping position, and backup pin 16 does not interfere with the circuit boards A1 and A2 during conveyance of the circuit boards A1 and A2.

Meanwhile, as shown in FIG. 3 (b), an upper end of backup pin 16 on backup plate 15 is lifted up to a height during clamping that is slightly higher than the board conveyance surface (upper faces of conveyor belts 19a and 19b) of conveyor 11 in a state in which backup plate 15 is lifted to the board clamping position, and the upper end of backup pin 16 abuts the lower face of the circuit boards A1 and A2 on conveyor 11, holds the circuit boards A1 and A2 from below, and prevents downward warpage (downward bending) of the circuit boards A1 and A2. Furthermore, clamp member 26 is pressed up by backup plate 15 in a process for lifting backup plate 15 to the board clamping position, and in the final stage, the circuit boards A1 and A2 on the upper end of clamp member 26 are caused to slightly float up from conveyor belts 19a and 19b, and the left and right lateral end portions of the circuit boards A1 and A2 are clamped by being indisposed between flange section 27 and clamp member 26 that are provided on the upper end inner side of conveyor rails 18a and 18b. The components are mounted on the circuit boards A1 and A2 and the component mounting board is produced in a state in which circuit boards A1 and A2 are clamped as such.

Figure 4:
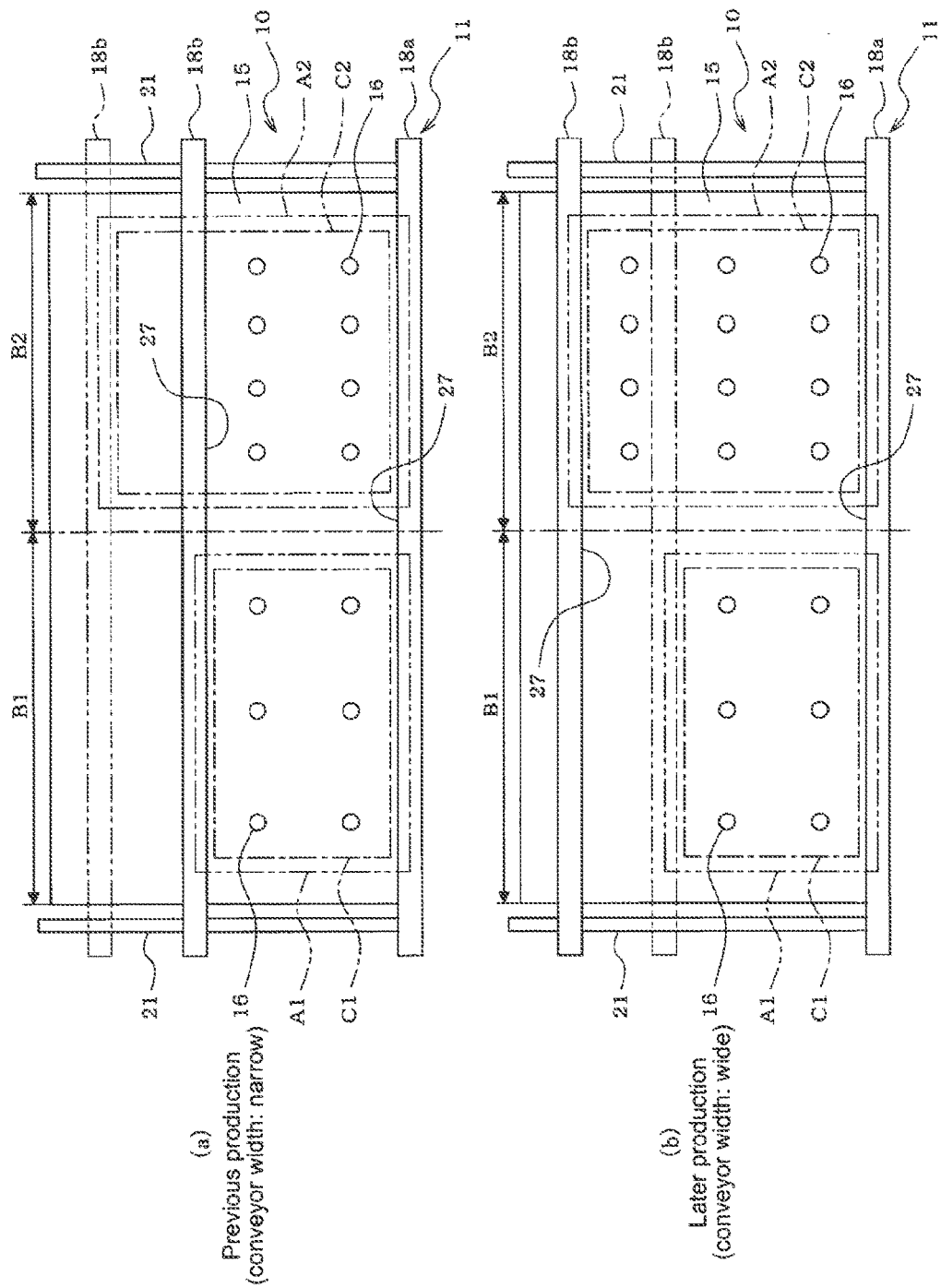
FIGS. 4(a) and 4(b) are plan views of a conveyor part in which arrangement of backup pins is described for a case of previous production where a component mounting board is produced with a narrow board width and later production where a component mounting board is produced with a wide board width.
Figure 5:
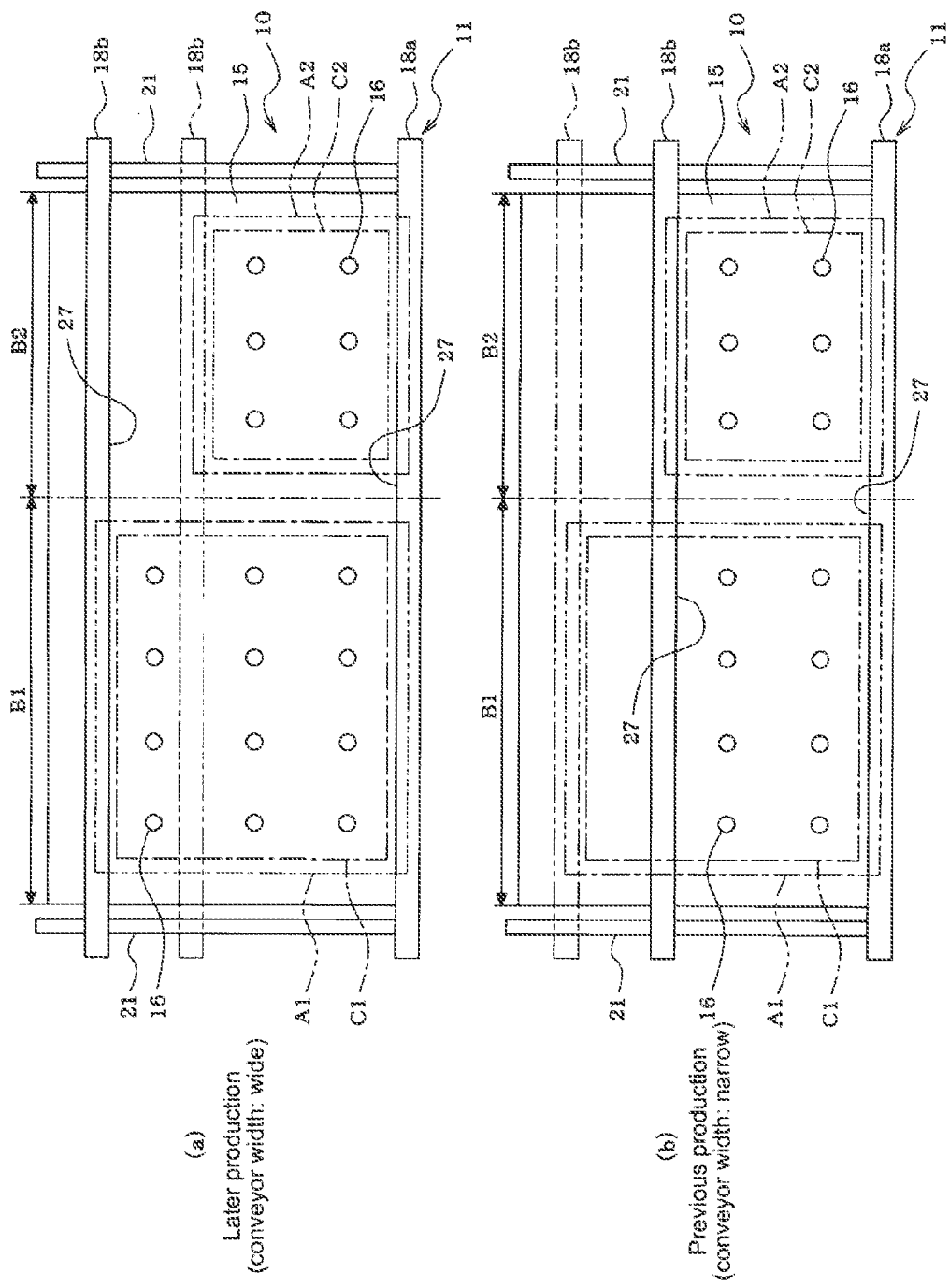
FIGS. 5(a) and 5(b) are plan views of a conveyor part in which arrangement of backup pins is described for a case of previous production where a component mounting board is produced with a wide board width and later production where a component mounting board is produced with a narrow board width.

Note that, if the size in the board conveyance direction (X-direction) of the component mounting board that is to be produced is reduced, as shown in FIGS. 4 and 5, it is possible to divide component mounting station 10 into two component mounting areas, B1 and B2, in the board conveyance direction and produce different types of component mounting boards in each of the component mounting areas B1 and B2. Conversely, if the size of the component mounting board that is to be produced is large in the board conveyance direction, it may not be possible to divide component mounting station 10 into two component mounting areas.

Therefore, in the present embodiment, the control device (control means: omitted from the drawings) that controls the action of each mechanism of the component mounting machine determines whether it is possible to divide component mounting station 10 into two component mounting areas, B1 and B2, in the board conveyance direction by obtaining the size of the circuit boards A1 and A2 that are used in each production instance based on a production plan in which two types of production are performed in order, and in a case where it is determined that division is not possible, one component mounting area is set without dividing the component mounting station 10 into the two component mounting areas B1 and B2, and one pin arrangement area is set without dividing backup plate 15 into two pin arrangement areas (member arrangement areas), C1 and C2, and a component mounting board is produced using the same method as in the related art. In this case, in each production switch, it is necessary to carry out a setup changeover to change the disposal pattern or number of backup pins 16 that are disposed on backup plate 15 according to the type, size, and the like of the component mounting board that is subsequently to be produced.

Meanwhile, in a case where the control device of the component mounting machine determines that it is possible to divide component mounting station 10 into the two component mounting areas B1 and B2 in the board conveyance direction from a production plan that performs two types of production in order, as shown in FIGS. 4 and 5, component mounting station 10 is divided into the two component mounting areas B1 and B2 in the board conveyance direction according to the size of the circuit boards A1 and A2 that are used in each production instance. At this time, one component mounting area may be a size to occupy the space of half or more of component mounting station 10, in short, each of circuit boards A1 and A2 fit into the two component mounting areas B1 and B2, and the two component mounting areas B1 and B2 may be divided so not to overlap and not protrude from component mounting station 10.

Furthermore, in a case where the control device of the component mounting machine divides component mounting station 10 into the two component mounting areas B1 and B2 in the board conveyance direction, the area in which backup pins 16 are disposed on backup plate 15 is divided into two pin arrangement areas, C1 and C2, corresponding to the two component mounting areas B1 and B2, and the quantity of backup pins 16 that are necessary to support the component mounting boards (circuit boards A1 and A2) that are produced in each component mounting area B1 and B2 in each pin arrangement area C1 and C2 are arranged in advance in a predetermined disposal pattern. Thereafter, the control device of the component mounting machine stops the circuit boards A1 and A2 that are transported using conveyor 11 into the component mounting areas B1 and B2 according to the type of component mounting board to be produced, lifts backup plate 15, clamps the circuit boards A1 and A2 by the clamp member 26, supports the circuit boards A1 and A2 by backup pins 16 of the pin arrangement areas C1 and C2 that are positioned below the circuit boards, and mounts the components on the circuit boards A1 and A2.

Note that, since conveyor 11 of the component mounting machine is configured to be able to adjust the conveyor width according to board width of the component mounting boards (circuit boards A1 and A2) to be produced, concerning a region that becomes an obstacle to the widening and narrowing of the conveyor width out of each pin arrangement area C1 and C2 on backup plate 15, it may be necessary to recover a backup pin that is used in previous production after previous production ends if it is not possible to arrange backup pins 16 that are used in later production in advance.

Therefore, as shown in FIG. 4, according to the production plan, in a case where the control device of the component mounting machine produces a component mounting board (circuit board A1) with a narrow board width out of two types of component mounting boards with different board widths in advance and thereafter produces a component mounting board (circuit board A2) with a wide board width by widening the conveyor width, as shown in FIG. 4 (a), the control device produces a component mounting board (circuit board A1) with a narrow board width at a conveyor width prior to widening by arranging backup pins 16 as much as it is possible to arrange at the conveyor width prior to widening in each pin arrangement area C1 and C2 on backup plate 15 before the start of previous production, and as shown in FIG. 4(b), produces a component mounting board (circuit board A2) with a wide board width at a conveyor width after widening by additionally arranging backup pins 16 by the insufficient amount in the pin arrangement area C2 in which the quantity of backup pins 16 is insufficient by widening the conveyor width after the production ends.

In addition, as shown in FIG. 5, according to a production plan, in a case where the control device of the component mounting machine produces in advance a component mounting board (circuit board A1) with a wide board width out of two types of component mounting boards with different board widths and thereafter produces a component mounting board (circuit board A2) with a narrow board width by narrowing the conveyor width, as shown in FIG. 5 (a), the component mounting board (circuit board A1) is produced with a wide board width at a conveyor width before narrowing by arranging the necessary quantity of backup pins 16 in each pin arrangement area C1 and C2 on backup plate 15 before the start of previous production and as shown in FIG. 5 (b), the component mounting board (circuit board A2) is produced with a narrow board width at a conveyor width after narrowing by narrowing the conveyor width after recovering backup pins 16 that become an obstacle to narrowing the conveyor width out of the backup pins 16 that are disposed in the pin arrangement area C1 that is used in previous production after the production ends.

Typically, since a component mounting line for producing a component mounting board is configured by arranging multiple component mounting machines along the board conveyance direction, there is a possibility that idle time (waiting time) occurs in which component mounting action is not performed during production according to a state of progress of production of adjacent component mounting machines.

Therefore, in the present embodiment, when arranging backup pins 16 in each pin arrangement area C1 and C2 on backup plate 15 in advance (before the start of previous production), the control device of the component mounting machine determines whether it is possible to dispose backup pin 16 in the pin arrangement area C2 that is used in later production by using idle time during previous production based on a production plan in which two instances of production are performed in order, and in a case where it is determined that disposal is possible, backup pins 16 are not arranged in advance in the pin arrangement area C2 that is used in later production, and backup pins 16 are arranged using idle time during previous production. By doing this, since it is possible to perform setup changeover of a backup pin 16 that is used in later production using idle time during previous production, it is not necessary to perform in advance setup changeover of backup pin 16 that is used in later production, and it is possible to shorten setup changeover time that is performed in advance.

In addition, in a case where backup pins 16 of each of the pin arrangement areas C1 and C2 on backup plate 15 are recovered, backup pins 16 of the pin arrangement area C1 that are used in previous production may be recovered using idle time during later production. By doing this, it is possible to shorten time for recovering backup pins 16 of the backup plate 15 after the later production ends.

In addition, in the present embodiment, the component that is picked up by the suction nozzle of mounting head 13 is imaged by component imaging camera 14 while moving the component within the visual field of component imaging camera (so-called on-the-fly imaging) in the middle of movement of the component that is held by the suction nozzle of mounting head 13 from feeder installation section 12 to the component mounting areas B1 and B2, the resulting image is processed, suction positional deviation, deviation of the rotation angle, and the like of the component are recognized, and during component mounting, suction positional deviation, deviation of the rotation angle, and the like of the component are corrected, and the component is mounted on the circuit board A1 or A2. At this time, as shown in FIG. 1, in order to increase movement speed of mounting head 13 that moves the component to the component mounting areas B1 and B2 from feeder installation section 12 through the component imaging areas, feeder installation section 12 is divided into feeder arrangement areas D1 and D2 that are used in each type of the component mounting boards to be produced, and component imaging camera 14 is disposed in the center of the board conveyance direction (X-direction) in the region between feeder installation section 12 and conveyor 11. Furthermore, disposition of the two feeder arrangement areas D1 and D2 of feeder installation section 12 and disposition of the two component mounting areas B1 and B2 of component mounting station 10 are disposed such that the positional relationship between the feeder arrangement areas D1 and D2 and the component mounting areas B1 and B2 used for each type of component mounting board to be produced is a positional relationship symmetrically close to the position of component imaging camera 14. Thereby, in a case where a component is mounted on the circuit board A1 of the component mounting area B1 on the upstream side (left side in FIG. 1) in the board conveyance direction, the component is picked up from the feeder arrangement area D1 on the downstream side (right side in FIG. 1) in the board conveyance direction and mounting head 13 is moved to the component mounting area B1 through the component imaging area. In addition, in a case where a component is mounted on the circuit board A2 of the component mounting area B2 on the downstream side (right side in FIG. 1) in the board conveyance direction, the component is picked up from the feeder arrangement area D2 on the upstream side (left side in FIG. 1) in the board conveyance direction and mounting head 13 is moved to the component mounting area B2 through the component imaging area.

By doing this, in a case where the component that is picked up by a suction nozzle of mounting head 13 is imaged by the component imaging camera 14 in the middle of moving the mounting head 13 from the feeder arrangement areas D1 and D2 to the component mounting areas B1 and B2 via a component imaging area, it is possible to reduce the curvature of the movement path of the mounting head 13 from the feeder arrangement areas D1 and D2 to the component mounting areas B1 and B2 via the component imaging area. Thereby, it is possible to perform on-the-fly imaging by moving the component that is held by the suction nozzle of mounting head 13 while increasing movement speed of mounting head 13 at a constant speed within the visual field of component imaging camera 14, and it is possible to shorten the cycle time by narrowing time that is necessary for imaging of the component.

Note that, an effect of on-the-fly imaging is an effect that is obtained even if the setup changeover of backup pins 16 of two types of production is not collectively performed in advance (that is, even if the setup changeover of backup pins 16 is performed in each production switch). Accordingly, in a case where only obtaining the effect of on-the-fly imaging is an object, in the same manner as in the related art, setup changeover of backup pins 16 may be performed at each production switch.

In the present embodiment described above, in a case where the control device of the component mounting machine determines that it is possible to divide component mounting station 10 into the two component mounting areas B1 and B2 in the board conveyance direction from a production plan that performs two types of production in order, component mounting station 10 is divided into the two component mounting areas B1 and B2 in the board conveyance direction according to the size of the circuit boards A1 and A2 that are used in each production instance, the area in which backup pins 16 are arranged on backup plate 15 is divided into two pin arrangement areas C1 and C2 corresponding to the two component mounting areas B1 and B2, the quantity of backup pins 16 that are necessary to support the component mounting boards (circuit boards A1 and A2) that are produced in each component mounting area B1 and B2 are arranged in each pin arrangement area C1 and C2 in advance in a predetermined arrangement pattern, the circuit boards A1 and A2 that are transported using conveyor 11 are stopped in the component mounting areas B1 and B2 according to the type of component mounting board to be produced, backup plate 15 is lifted up, and the circuit boards A1 and A2 are clamped by clamp member 26, and the circuit boards A1 and A2 are supported by backup pins 16 of the pin arrangement areas C1 and C2 that are positioned below the circuit boards, and components are mounted on the circuit boards A1 and A2, therefore it is possible to arrange backup pins 16 used in two types of production in advance on backup plate 15 divided between the two pin arrangement areas C1 and C2. Therefore, it is not necessary to perform setup changeover of backup pins 16 for every each production switch, and it is possible to lower the number of times of setup changeover of backup pins 16. Thereby, it is possible to efficiently perform setup changeover of backup pins 16, and it is possible to improve productivity (operating rate of a component mounting machine) by shortening the total setup changeover time in one day.

Note that, in the present embodiment, setup changeover in which backup pins 16 are arranged on backup plate 15 is performed automatically, but even in a case where setup changeover is performed manually by an operator, it is possible to realize an object of the present disclosure.

In addition, in the present embodiment, mounting station 10 is divided into two component mounting areas, B1 and B2, in the board conveyance direction and backup plate 15 is divided into two pin arrangement areas, C1 and C2, but in a case where the size of the circuit board that is used in each production instance is small, backup plate 15 may be divided into three or more pin arrangement areas by dividing mounting station 10 into three or more component mounting areas in the board conveyance direction.

Otherwise, the present disclosure is not limited to the embodiments described above, and it goes without saying that various modifications can be made without deviating from the gist of the present disclosure, such as that two conveyors 11 may be disposed in the component mounting machine, the disposal location of stocker 17 may be changed, the configuration of the clamp mechanism that clamps the circuit boards A1 and A2 on conveyor 11 may be changed, the arrangement pattern and the quantity of backup pins 16 that are arranged in each pin arrangement area C1 and C2 on backup plate 15 may be changed as appropriate, the type of backup pin 16 that is arranged in each pin arrangement area C1 and C2 may be changed, and alternatively, as the backup member, not only backup pin 16 but also multiple rectangular parallelepiped-shaped backup blocks may be arranged in the same manner.

REFERENCE SIGNS LIST

10: component mounting station, 11: conveyor, 12: feeder installation section, 13: mounting head, 14: component imaging camera, 15: backup plate, 16: backup pin (backup member), 17: stocker, 18*a*, 18*b*: conveyor rail, 19*a*, 19*b*: conveyor belt, 20*a*, 20*b*: support member, 22: feeder, 26: clamp member, A1, A2: circuit board, B1, B2: component mounting area, C1, C2: pin arrangement area (member arrangement area), D1, D2: feeder arrangement area

The invention claimed is:

1. A component mounting machine comprising:
   a conveyor which transports a circuit board to a component mounting station;
   a backup plate that is disposed below the component mounting station to be movable up and down; and
   multiple backup members configured to be arranged on the backup plate to be replaceable,
   wherein a component mounting board is produced by mounting a component on the circuit board by supporting the circuit board that is transported to the component mounting station by the multiple backup members from below by lifting the backup plate,
   the component mounting station is configured to be divided into multiple component mounting areas in a board conveyance direction, and it is possible to produce various different component mounting boards in each component mounting area,
   the area in which the backup members are configured to be arranged on the backup plate is divided into multiple member arrangement areas corresponding to the multiple component mounting areas and a required quantity of the backup members, which are necessary to support the component mounting board that is produced in each component mounting area, are arranged in each member arrangement area, before the mounting is performed, in a predetermined disposal pattern, and
   a controller configured to control actions of the component mounting machine so as to arrange the backup members in the multiple member arrangement areas, stop a circuit board that is transported on the conveyor in the component mounting area corresponding to the type of component mounting board to be produced, lift the backup plate, support the circuit board by the backup members of the member arrangement area that is positioned below the circuit board, and mount the component on the circuit board, the backup members in all of the member arrangement areas being arranged before mounting is performed such that no arrangement of the backup members is performed during mounting irrespective of the type of circuit board being produced.

2. The component mounting machine according to claim 1, further comprising:
   a stocker that stores the multiple backup members for disposing on the backup plate; and
   a mounting head to which a chuck that is able to hold one of the backup members is attached,
   wherein the controller is configured to control a moving action of the mounting head and an opening and closing action of the chuck, and control an action for gripping the one of the backup members on the backup plate with the chuck and storing the one of the backup members in the stocker, and an action for gripping the one of the backup members with the chuck according to one of the member arrangement areas from the multiple backup members that are stored in the stocker and arranging the one of the backup members in the one of the member arrangement areas.

3. The component mounting machine according to claim 1,
   wherein the controller is configured to determine whether it is possible to divide the component mounting station into the multiple component mounting areas in the board conveyance direction based on a production plan in which multiple instances of production are performed in order, and in a case where it is determined that division is not possible, one component mounting area is set without dividing the component mounting station into multiple component mounting areas, and one member arrangement area is set without dividing the backup plate into multiple member arrangement areas.

4. The component mounting machine according to claim 1,
   wherein the conveyor is configured to be able to adjust a conveyor width according to board width of the component mounting board to be produced,
   (1) in a case where a component mounting board with a narrow board width out of two types of component mounting boards with different board widths is produced in advance and thereafter a component mounting board with a wide board width is produced by widening the conveyor width, a component mounting board is produced with a narrow board width at a conveyor width before widening by arranging backup members as much as it is possible to arrange at the conveyor width before widening in each member arrangement area on the backup plate before the start of previous production, and a component mounting board is produced with a wide board width at a conveyor width after widening by additionally arranging backup members by the insufficient amount in the member arrangement area in which the number of backup members is insufficient by widening the conveyor width after the production ends,
   (2) in a case where a component mounting board with a wide board width out of two types of component mounting boards with different board widths is produced in advance and thereafter a component mounting board with a narrow board width is produced by narrowing the conveyor width, a component mounting board is produced with a wide board width at a conveyor width before narrowing by arranging the necessary number of backup members in each member arrangement area on the backup plate before the start of previous production, and a component mounting board is produced with a narrow board width at a conveyor width after narrowing by narrowing the conveyor width after recovering backup members that become an obstacle to narrowing the conveyor width out of the backup members that are arranged in the member arrangement area that is used in previous production after the production ends.

5. The component mounting machine according to claim 1, further comprising:
   a feeder installation section in which multiple feeders that supply components are arranged, a mounting head that holds a component that is supplied by the feeder and mounts the component on the circuit board, and a component imaging camera that images from below the component that is held by the mounting head, wherein in the feeder installation section, the feeder arrangement area to be used is classified for each type of component mounting board to be produced, the component imaging camera is disposed in the center in the board conveyance direction of the region between the feeder installation section and the conveyor, the component that is held by the mounting head is imaged by the component imaging camera while moving the component within the visual field of the component imaging camera in the middle of movement of the component that is held by the mounting head from the feeder arrangement area to the component mounting area, and disposition of the multiple feeder arrangement areas of the feeder installation section and disposition of multiple component mounting areas of the component mounting station are made such that the positional relationship between the feeder arrangement area and the component mounting area used for each type of component mounting board to be produced is a positional relationship symmetrically close to the position of the component imaging camera.

6. A method for operating a component mounting machine comprising:

providing a component mounting machine according to claim 1;

arranging the backup members in the multiple member arrangement areas;

stopping a circuit board that is transported on the conveyor in the component mounting area according to the type of component mounting board to be produced;

lifting the backup plate;

supporting the circuit board by the backup member of the member arrangement area that is positioned below the circuit board; and mounting the component on the circuit board.

* * * * *